(12) United States Patent
Sedou et al.

(10) Patent No.: US 11,838,029 B2
(45) Date of Patent: Dec. 5, 2023

(54) SYSTEM FOR COMBINING DIGITAL STREAMS AND METHOD FOR COMBINING DIGITAL STREAMS (VARIANTS)

(71) Applicant: SWI Kommunikations und Computer GmbH, Berlin (DE)

(72) Inventors: Vitali Anatolevich Sedou, Berlin (DE); Igor Vitalievich Sedov, Berlin (DE)

(73) Assignee: Igor Vitalievich Sedov, Berlin (DE)

( * ) Notice: Subject to any disclaimer, the term of this patent is extended or adjusted under 35 U.S.C. 154(b) by 266 days.

(21) Appl. No.: 17/520,259

(22) Filed: Nov. 5, 2021

(65) Prior Publication Data

US 2022/0149860 A1    May 12, 2022

(30) Foreign Application Priority Data

Nov. 6, 2020   (RU) ............................ RU2020136562

(51) Int. Cl.
*H03M 1/12* (2006.01)
*G06F 13/42* (2006.01)
(Continued)

(52) U.S. Cl.
CPC ........ *H03M 1/125* (2013.01); *G06F 13/4282* (2013.01); *H03K 19/1774* (2013.01);
(Continued)

(58) Field of Classification Search
CPC ...... H03M 1/125; H03M 1/123; H03K 19/20; H03K 19/1774; G06F 13/4282
(Continued)

(56) References Cited

U.S. PATENT DOCUMENTS 8,920,383 B2 * 12/2014 Enggaard .......... A61M 5/31553
604/207
10,467,007 B1 * 11/2019 Santee ................ G06F 13/4291
(Continued)

*Primary Examiner* — Peguy Jean Pierre
(74) *Attorney, Agent, or Firm* — Perry S. Clegg; Johnson & Martin, P.A.

(57) ABSTRACT

This invention relates to multichannel signal processing systems using synchronous protocols I2S (Inter-IC Sound Bus) and SPI (Serial Peripheral Bus) for sequenced data exchange, and providing unified synchronization of processed data. The system and method for synchronously multiplexing data streams in the I2S or SPI formats involves transformation of a standard Left/Right Clock (LRCK) sampled pulse signal of the I2S format or a Chip Select (CS) pulse signal of the SPI format into a LRCLt signal comprising a time stamp code and start and end marker codes of the synchronization clock signal, LRCK or CS, respectively. The presence of the marker codes and the time stamp code enables to restore the pulse signal, LRCK or CS, respectively, in the process of data stream program processing and link each discrete sample to the time stamp. The digital stream multiplexing system includes m channel groups for collection of synchronous data in the I2S or SPI synchronous protocol, a clock generator, a host processor and a means of transforming the LRCK or CS signal into the LRCKt signal. The technical effect consists in removal of limitations on a number of fully synchronized data streams in the I2S or SPI formats and, at the same time, simplification of the synchronization system and method and reduction in requirements to hardware resources.

7 Claims, 2 Drawing Sheets

(51) Int. Cl.
*H03K 19/17736* (2020.01)
*H03K 19/20* (2006.01)
*H03M 1/50* (2006.01)

(52) U.S. Cl.
CPC ............ *H03K 19/20* (2013.01); *H03M 1/123* (2013.01); *H03M 1/508* (2013.01)

(58) Field of Classification Search
USPC .......................................... 341/155, 159, 50
See application file for complete search history.

(56) References Cited

U.S. PATENT DOCUMENTS

| | | | |
|---|---|---|---|
| 2015/0100716 A1* | 4/2015 | Rencs | G06F 13/385 |
| | | | 710/308 |
| 2017/0168980 A1* | 6/2017 | Kilzer | G06F 13/4291 |
| 2019/0210368 A1* | 7/2019 | Eguchi | H10N 30/8554 |
| 2020/0210368 A1* | 7/2020 | Yang | G06F 13/4282 |

* cited by examiner

SYSTEM FOR COMBINING DIGITAL STREAMS AND METHOD FOR COMBINING DIGITAL STREAMS (VARIANTS)

This invention relates to multi-channel signal processing systems wherein synchronous protocols I2S (Inter-IC Sound Bus) and SPI (Serial Peripheral Bus) are used for sequenced data exchanges, and unified synchronization of processed data is provided.

The popularity of the I2S and SPI data exchange protocols is based on their wide use for connecting chips of various types to control microcontrollers, microcomputers, powerful processor systems, as well as on the fact that many analog-to-digital converters (ADC) and digital-to-analog converters (DAC) are provided with interfaces operating on these protocols. Thus, such ADCs find the widest application in constructing multichannel systems with microphone arrays, RF phase-locked arrays, SDR (i.e., Software Defined Radio, software defined radio system, or radio defined by software), multichannel receivers for aviation or railroad communications, multichannel coherent receivers for systems of high-accuracy sound, ultrasound or radio direction finding with a zero or near-zero intermediate frequency (Zero IF, or Near Zero IF), multichannel receivers for radio monitoring of broadcasting radio stations, etc.

In the above application fields, two important tasks arise. The first task is to multiplex a plurality of serial I2S or SPI digital data streams into a single high-level network interface (mostly USB or Ethernet) for conjugation with a host computer. The second task is to keep temporal relations between channel signals or groups of channel signals.

The requirement of keeping temporal relations between channel signals or groups of channel signals is especially important, since, in the listed exemplary applications, temporal (phase) relations between signals are determinative for quality characteristics of multichannel systems.

The known methods for solving the task of transforming serial digital streams into an asynchronous stream of USB or Ethernet are methods based on the use of a FPGA chip (or Integrated Circuit Field-Programmable Gate Array) and a FIFO chip (or Integrated Circuit First In First Out). Thus, the article «MICARRAY—A System for Multichannel Audio Streaming over Ethernet» by Christoph Reitbauer, Harald Rainer, Markus Noisternig, Bernhard Rettenbacher, Franz Graf; 5th Congress of Alps-Adria Acoustics Association, 12-14 Sep. 2012, Petrčane, Croatia, discusses the use of a FPGA Spartan-6 chip for combining an n number of I2S streams generated by an n-ADC microphone array.

A similar technical solution is proposed in the project entitled "The NIST Smart Space Project-Microphone Array" (see: https://www/nist.gov/itl/iad/mig/nist-smart-space-project/nist-smart-space-project-microphone-array), which is developed in the National Institute of Standards and Technology, US Department of Commerce, 2016.

The article "An Universal USB 3.0 FIFO Interface For Data Acquisition" by K. Mroczek, Measurement Automation Monitoring, December 2016, vol. 62, ISSN 2450-2855 discusses the possibility of collecting various data transmitted from n-ADCs with the use of a FIFO chip. Microchips of two IC manufacturers are analyzed: FTDI (Future Technology Devices International)—FT601Q and Cypress Semiconductor—SuperSpeed FX3.

The use of buffer FIFO chips for combining several I2S or SPI streams is disclosed in U.S. Pat. No. 9,842,071 "Multi-Channel I2S Transmit Control System and Method" for implementing a procedure of forwarding a digital data stream into a microcontroller. A disadvantage of this solution is that it provides for synchronization between data in various channels only within one microcontroller having a limited number of embedded FIFO chips. If it is necessary to increase a number of combined channels with the use of a group of microcontrollers, the problem of synchronization of channel data streams relating to different microcontrollers.

Also, methods and devices proposed by XMOS company are known, which are based on the use of a series of xCore chips—multicore and multithreaded controllers (see, for example, Application Guide "Multichannel Digital Audio Connectivity", Document Number: XM10299A, XMOS, 2016. "USB Audio Design Guide", Document Number: XM0088546.1, XMOS, 2016). These ICs provide transformation of input and output I2S streams into the USB 2.0 interface.

Digitized data being transmitted from ADC via the SPI interface are combined with the use of a FPGA chip provided with a USB controller for connecting to a host computer.

One common drawback of the above solutions known in the art is a limited number of channels where a unified level of channel signal latency may be provided when two or more USB/Ethernet ports are scaled. This is related to the fact that, when I2S or SPI synchronous streams are combined into asynchronous USB/Ethernet interfaces, a floating delay between data received from various USB/Ethernet ports arises. The existing limitations to a number of channels in FPGA, FIFO, xCore IC limit, as a rule, are limited to a number of possible channels within the limits of 16, 24, 32 wherein a unified latency level may be provided.

A method and a device are known that provide the same level of latency within a single FPGA chip; they are described in the proceedings of Audio Engineering Society by Yonghao Wang, Xiangyu Zhu and Qiang Fu "A low latency multichannel audio processing evaluation platform", $132^{nd}$ Convention, Budapest, Hungary, 2012. The authors analyze 12-channel system with 24-bit coding when digital filters of various architectures are used. A disadvantage of this solution is also the absence of a possibility to synchronize and align time delays in scalable systems using more than one FPGA chip.

A method for determining a signal delay time by measuring the mutual correlation function coupling signals at the system input and output is known, which is described in the book "Random Data: Analysis and Measurement Procedures" by Bendat J. and Piersol A. The authors note that, since a system output signal is time-shifted relative to an input signal, the mutual correlation function will have a peak value when the shift value is equal to a time period necessary for a signal to pass through the system. This assertion is true because an average product value of two linearly coupled signals is at a maximum when a time shift between the signals is equal to zero. Hence, a signal latency time may be determined by a shift value corresponding to the peak on the mutual correlogram that couples these input and output signals. However, this method is convenient in practice only for high values of signal latency and is poorly usable when such values are low.

A method, which provides calculation of mutual correlation functions for calibrating channel responses, is described in U.S. Pat. No. 5,056,051 "Signal directional finding processor using fast Fourier transforms for receiver matching". A disadvantage of this method is the necessity of using a noise generator and an RF antenna switch for providing calibration noise voltage to inputs of channel receivers.

Also, a processing device effecting calculation of mutual correlation functions will bear higher load.

The closest prior art of the present invention is a method and a system for implementing it described in Chinese Patent Application CN109245841 "Multichannel FM broadcast audio information collecting device, method and system". The system comprises a source of receivable signals (antenna, splitter), a pre-processing unit (radio reception processing unit), 16 ADCs with digital outputs in the I2S format, a primary processor, a host computer and a clock oscillator.

In this analogous system, I2S or SPI streams are combined in the primary processor based on a multicore, multithreaded xCore controller, and time synchronization of data streams may be done only by the single primary processor.

If the system is implemented with a plurality of primary processors, a significant drawback of this closest analog is the necessity of using an additional port for receiving data from the primary processor for synchronization, which decreases the already limited processor resource in respect of combined streams, which is mentioned in the description of FIG. 4. The radio reception processing chips Si4731 used in the pre-processing units already comprise two ADCs each, but the inventors use additional external 8-channel ADCs CS5368 with additional time-division multiplexing of channels (TDM Interface Format).

Another disadvantage of this system is the low sample frequency of 44.1 kHz conditioned by the limited capacity of the xCore primary processor used.

The technical problem addressed by the present group of inventions consists in synchronizing data streams in the I2S or SPI formats, which are received from a signal source groups in multichannel cascade configurations with asynchronous interfaces without using additional individual ports of the main processor for time-division synchronization.

The technical effect achieved by this solution of the above technical problem consists in eliminating limitations on a number of fully synchronized data streams in the I2S or SPI formats, that is, providing the possibility of constructing multichannel systems having an unlimited number of fully synchronized data streams in the I2S or SPI formats with simultaneous simplification of the synchronization system and method and reduction of requirements to hardware resources.

In essence, the technical problem is solved and the technical effect is achieved due to that the system and method for synchronously combining data streams in the I2S or SPI formats presuppose transformation of the standard sampled clock signal Left/Right Clock (LRCK) in the I2S format (hereinafter, also referred to as the LRCK pulse signal) or the standard chip select signal (CS) of the SPI format (hereinafter, also referred to as the CS pulse signal) into the LRCLt signal comprising a time stamp code as well as start and end marker codes of the LRCK or CS signal, respectively. The presence of the marker codes and the time stamp code enables to restore the pulse signal, LRCK or CS, respectively, in the process of data stream program processing and couple each discrete sample to the time stamp.

Due to identity of signal circuits both of the LRCK pulse signal of the I2S format and the CS pulse signal of the SPI format, hereinafter, in designations on the block diagram and time charts, "LRCK/CS" is used, indicating that, depending on the format, a signal circuit may be either LRCK or CS.

In particular, in order to implement the claimed invention and achieve the stated technical effect, the system for combining digital streams, specifically digital streams of the I2S or SPI synchronous protocol, in its multichannel cascade configurations with asynchronous interfaces comprises m groups of channels for collecting synchronous data in the I2S or SPI synchronous protocol format, a clock oscillator, a host processor and a means of transforming a LRCK or CS pulse signal into a LRCKt signal.

Each group of channels for collecting synchronous data in the I2S or SPI synchronous protocol comprises a means for pre-processing of analog signals, which has N inputs for processing signals transmitted from N sources of analog signals, and N outputs, N/2 paired analog-to-digital converters (ADC), each having N inputs, a data stream clock synchronization input, a common synchronization input, a frame synchronization input and N/2 outputs, and a main processor with asynchronous interface, which has N/2 inputs and a data recording input, the N outputs of the pre-processing means being connected to N inputs of the N/2 ADCs, and the N/2 ADC outputs being connected to the N/2 inputs of the main processor.

The clock oscillator comprises a control input, a first output forming a clock signal for synchronization of a BCLK data stream (hereinafter, referred to as the BCLK clock signal), a second output forming a MCLK service signal for common synchronization, and a third output forming a LRCK or CS pulse signal.

The host processor comprises a control bus and at least two asynchronous interfaces to which said at least two groups of channels are connected.

The means of transformation of the LRCK or CS pulse signal into the LRCKt signal comprises a circuit for selecting an edge and a fall of the LRCK or CS pulse signal, a shift register having a data transfer input, a first "AND" circuit and a second "AND" circuit, each of them having a first control input, a second control input, and a digital output, and a binary counter having a count input and digital outputs.

The control input of the clock oscillator is connected to the control bus of the host processor. The first output of the clock oscillator is connected to the ADC data stream clock synchronization input, the data recording input of the main processors, and the data transfer input of the shift register. The second output of the clock oscillator is connected to the ADC common synchronization inputs. The third output of the clock oscillator is connected to the ADC frame synchronization input, the input of the circuit for selecting an edge and a fall of the LRCK or CS pulse signal, the first control input of the first "AND" circuit and the first control input of the second "AND" circuit. The second control input of the first "AND" circuit and the second control input of the second "AND" circuit are configured to preliminary set fixed codes of the Nstart marker and the Nend marker of the LRCK or CS pulse signal. The digital output of the first "AND" circuit is connected to low-order bits D0 of the shift register, the digital output of the second "AND" circuit is connected to high-order bits D2 of the shift register, and the digital output of the binary counter is connected to intermediate-order bits D1 of the shift register. The count input of the binary counter and the recording input of the shift register are connected to the output of the circuit for selecting a rising edge and a falling edge of the LRCK or CS pulse signal.

In order to implement the claimed invention and achieve the stated technical effect, the method for combining digital streams of the I2S format, specifically by means of the above system for combining digital streams, comprises reception of an analog signal array having a mN volume, which signals are transmitted from the m groups of channels for collecting synchronous data in the I2S or SPI synchronous protocol format, each group of channels including N analog signals; pre-processing of the analog signal array; forwarding of the processed analog signal array to the paired ADCs, and transformation of the array into a serial digital code in the I2S format together with formation of N/2 serial data digital streams; forwarding of these serial data digital streams to the main processor inputs with recording at edges of BCLK clock signal pulses transmitted from the clock oscillator; embedding of a time stamp into the LRCK pulse signal; and, after recording the codes Nstart, Nt and Nend into the register under the action of the BCLK clock signal pulses at the output of the shift register; formation of a sequence of pulses of the complex LRCKt clock signal. The embedding of the time stamp into the LRCK pulse signal includes transformation of the LRCK pulse signal into the LRCKt signal at which the binary counter generates a digital code of the time stamp; the code of the Nt time stamp is recorded into the shift register at the edges of the pulses, and a change in the binary counter state is fixed at the falls of the pulses; the markers Nstart and Nend of the LRCK pulse signal are recorded into the shift register simultaneously with the recording of the Nt time stamp code, but only at the times when the LRCK pulse signal has a high level.

In order to implement the claimed invention and achieve the stated technical effect, the method for combining digital streams of the SPI format, specifically by means of the above system for combining digital streams, comprises reception of an analog signal array having a mN volume, which are transmitted from the m groups of channels for collecting synchronous data in the synchronous protocol format, each group of channels including N analog signals; pre-processing of the analog signal array; forwarding of the processed analog signal array to the paired ADCs, and transformation of the array into a serial digital code in the SPI format together with formation of N/2 serial data digital streams; forwarding of these serial data digital streams to the main processor inputs with recording according to edges of CS clock signal pulses transmitted from the clock oscillator; embedding of a time stamp into the CS pulse signal; and, after recording the codes Nstart, Nt and Nend into the register under the action of the BCLK clock signal pulse at the output of the shift register; formation of a sequence of pulses of the complex LRCKt clock signal. The embedding of the time stamp into the CS pulse signal includes transformation of the CS pulse signal into the LRCKt signal at which the binary counter generates a digital code of the time stamp; the code of the Nt time stamp is recorded into the shift register by the edges of the pulses, and a change in the binary counter state is fixed by the false edges of the pulses; and a change in the binary counter state is fixed by the falls of the pulses; simultaneously with the recording of the code of the Nt time stamp, the markers Nstart and Nend of the CS pulse signal are recorded into the shift register, but only at the times when the CS pulse signal has a high level.

The above pre-processing of an analog signal array may include, in particular, amplification, filtration and transformation, depending on properties specific to analog signals.

Below, this invention is described in more detail by its possible embodiment with reference to the drawings.

Figure 1:
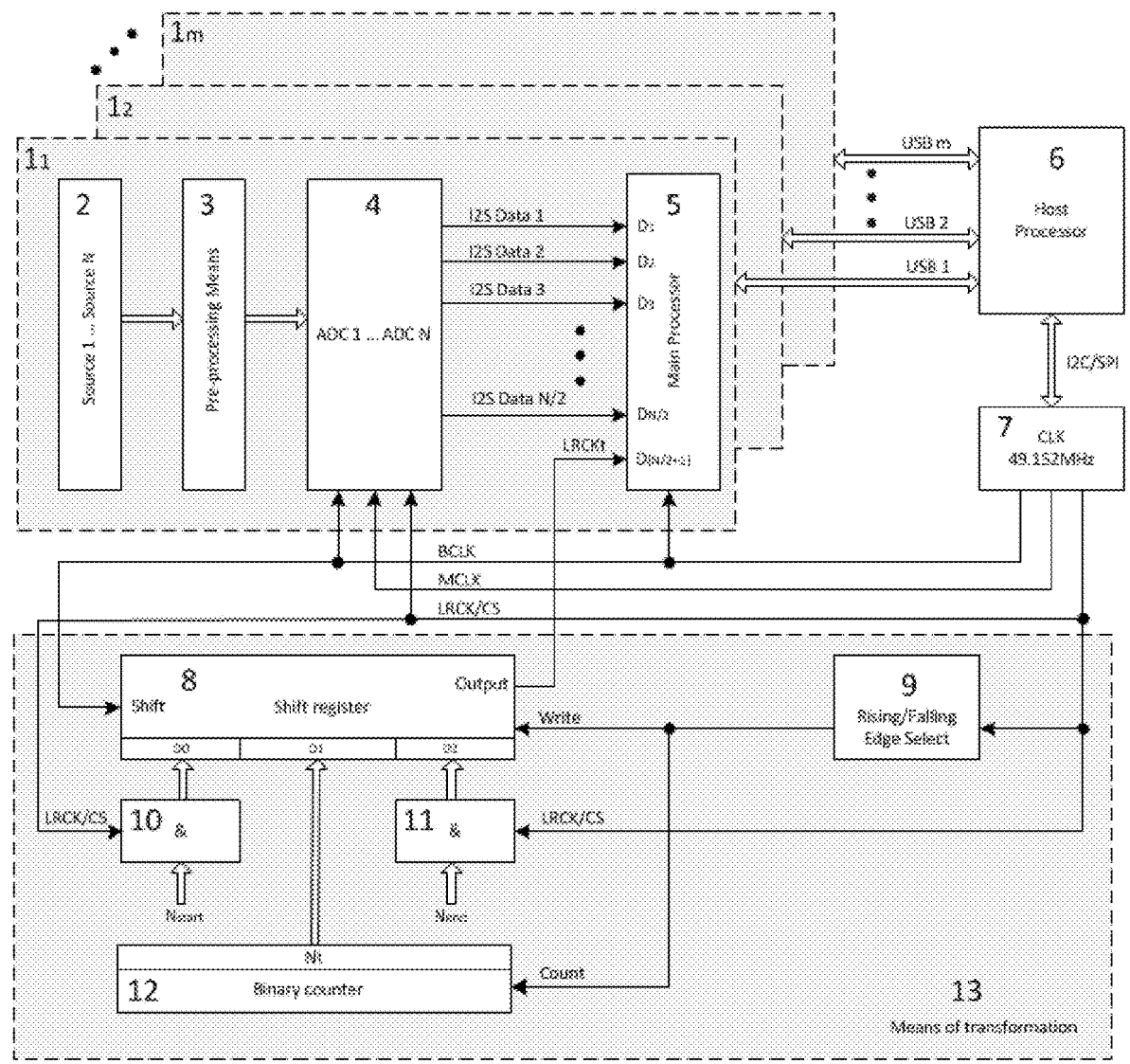
FIG. 1 shows a structure diagram of the system for synchronously combining digital I2S or SPI streams in multichannel cascade configurations with asynchronous interfaces.

The following elements of the claimed system for combining digital streams are shown in the figures:

1—a group of channels, N channels in each group for collecting synchronous data in the I2S or SPI format. Division by groups (m groups) is conditioned by limited resources of the existing FIFO, FPGA, xCore chips permitting configurations with not more than 32 ports in a single group;

2—sources of analog signals. They may be, for example, an antenna with an RF signal splitter, a phased-array antenna group, microphone-array group, a group of pseudo Doppler direction finding system antennas;

3—pre-processing means. It isolates information signals transmitted from analog signal sources by using filtration, additional amplification, frequency conversion, demodulation. The usable methods for pre-processing of analog signals are determined by typical properties specific to input signals, and they are well-known to a person skilled in the art. For example, amplification and filtration procedures may be used for acoustic signals; amplification, filtration, frequency conversion, demodulation, decoding, secondary filtration may be used for RF signals; etc.;

4—paired analog-to-digital converters (ADC). They convert analog signals into a digital serial code in the I2S or SPI format;

5—main processor. It serves for receiving N/2 digital data streams, adding time stamps to discrete samples and transforming modified N/2 digital streams with time stamps into an asynchronous stream of the USB or Ethernet format. It may be realized in the form of a FIFO, FPGA or xCore chip;

6—host processor. It is provided for receiving asynchronous data transmitted from m channel groups and their decoding with the use of matrix algorithms and final processing;

7—programmable clock oscillator. It can be programmed by the host processor via an I2C or SPI bus. It forms all clock signals necessary for the system operation, in particular:

a) a LRCK sample clock signal for a I2S stream or a CS chip selection signal for a SPI stream with frequencies of 48 kHz, 96 kHz, 192 kHz, 394 kHz or 768 kHz, or other frequencies used for a stream of the SPI format;

b) a BCLK clock signal for synchronization of a data stream. It determines a bit rate of a serial data stream of the I2S or SPI format and may be selected by the condition:

$$FBCLK=fd\cdot 2k,$$

where: FBCLK—clock rate of a BCLK clock signal data stream; fd—fLRCLK is sampling rate; k—a number of ADC bits. For example, at the sampling rate of 48 kHz for 32-bit coding the clock rate of a data stream is 3,072 kHz;

c) a service clock signal for general synchronization of the ADC operation. It is set in the ADC specification and usually has a value of 24,576 kHz or 49,152 kHz;

8—shift register. It is provided for transformation of a standard LRCK or CS pulse signal into a modified LRCKt signal comprising a time stamp code and start and end marker codes for LRCK or CS pulse signals. The register capacity, which is equal to the sum of low-order bits D0, intermediate-order bits D1 and high order bits D2, is determined by an ADC coding capacity. For example, for an I2S stream the capacity usually is 16, 24 or 32 bits;

9—diagram of isolating the edge and the fall of a LRCK or CS pulse signal. A binary counter code is recorded at the edge of each of these short pulses, and the state of the binary counter is changed at the fall;

10, 11—"AND" logic circuits. They are used for gating fixed marker codes Nstart and Nend with a LRCK or CS pulse signal;

12—binary counter. It is provided for forming a digital code of a time stamp which is embedded into a LRCK or CS pulse signal by means of the shift register, thus forming a modified LRCKt signal. The capacity Nt of the binary counter is determined on the following condition:

$$NADC=Nstart+Nt+Nend,$$

where: NADC—capacity of ADCs in use; Nstart—capacity as well as a value of the Nstart fixed marker code of the LRCK or CS pulse signal; Nt—capacity as well as a value of the binary counter (capacity of the time stamp); Nend—capacity as well as a value of Nend fixed marker code of the LRCK or CS pulse signal;

13—means of transformation of a LRCK or CS pulse signal into a LRCKt signal. It transforms a standard LRCK or CS pulse signal into a complex signal comprising a time stamp and start and end markers of the LRCK or CS pulse signal.

The claimed methods for combining digital stream in multichannel cascade configurations with asynchronous interfaces and the claimed system implementing these methods may be operated as follows.

As shown in FIG. 1, an analog signal array having a mN volume, which is transmitted from m groups 11, 12, . . . 1m by N signals in the group transmitted from the analog signal sources 2, e.g., from a microphone array, is fed to the pre-processing means 3, where it is amplified, filtered and transformed, depending on properties specific to analog signals. The processed analog signal array is transmitted to the paired ADCs 4 from the pre-processing means 3, where it is transformed into a serial digital code in the form of an I2S or SPI stream. Paired or double-channel ADCs are standard devices usable in audio equipment for the I2S format, as opposed to the SPI format, where both single-channel and double-channel configurations are used. Here, it should be noted that the SPI stream protocol has two data transmission lines—MOSI and MISO (recording and reading, respectively), and the I2S protocol has only one data line. In their structure, these lines are quite similar. Since only reading is actual for the purposes of this invention, the recording line for the SPI stream protocol is not considered. Generally, a switch of the I2S/SPI modes and an additional link with the main processor may be provided.

As a result of combination in pairs, N/2 digital streams of serial data are formed at the output of the ADC 4. This data is transmitted to the inputs of the main processor 5, into which it is recorded at the rising edge of BCLK clock signal pulses transmitted from the clock oscillator 7 (FIG. 2a).

The clock oscillator 7 is programmed by the host computer via the I2C or SPI bus so as to assure various operating rates for the ADC and data streams. Thus, sampling rate (LRCK or CS pulse signal) may be set by programming for various standard modes: 48 kHz, 96 kHz, 192 kHz, 384 kHz or 768 kHz, or other frequencies for a SPI stream.

Figure 2:
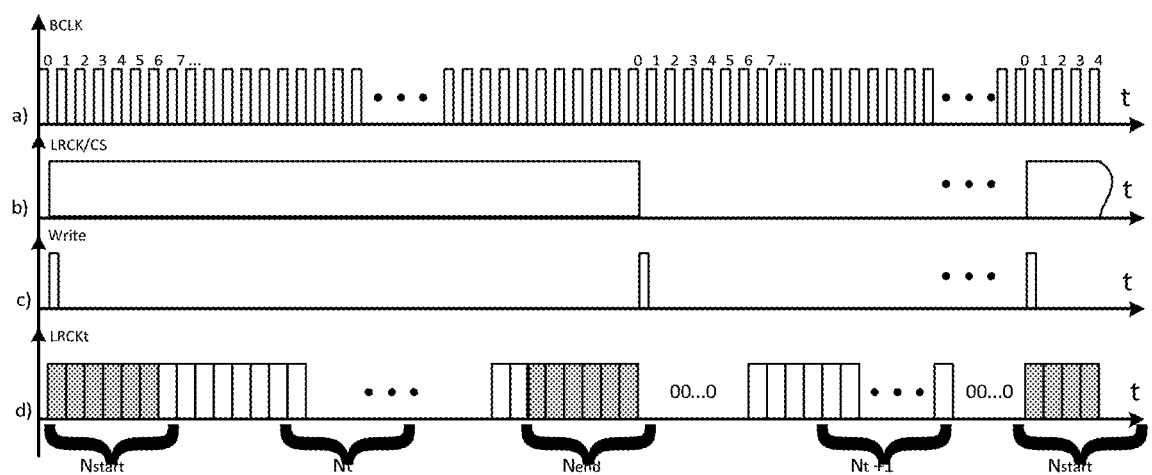
FIG. 2 shows time charts explaining operation of the system for synchronously combining digital I2S or SPI streams in multichannel cascade configurations with asynchronous interfaces.

The LRCK or CS pulse signal is also used for frame synchronization of data streams by being transmitted to the frame synchronization input of the ADC 4 (FIG. 2b).

A FBCLK data stream rate corresponding to the sampling rate may be set similarly.

In order to embed a time stamp into a LRCK or CS pulse signal, the means 13 is used that transforms the LRCK or CS pulse signal into a LRCKt signal. A time stamp digital code is generated by the binary counter 12 that changes its states under the action of short pulses formed by the circuit 9 of isolating the edge and the fall of the LRCK or CS pulse signal (FIG. 2c). The code of the Nt time stamp is recorded into the shift register 8 at the edge of short pulses, and the state of the binary counter 12 is changed at the fall.

Simultaneously with the recording of the Nt time stamp code, the markers Nstart and Nend of the LRCK or CS pulse signal are recorded into the shift register. The Nstart and Nend markers are recorded via the "AND" circuits 10, 11 only at times when the LRCK or CS pulse signal has the high level. After the Nstart, Nt H Nend codes are recorded into the register 8 under the action of BCLK clock signal pulses, a sequence of the LRCKt complex clock signal pulses is formed at the output of the shift register, as shown in FIG. 2d.

It is shown in FIG. 2d that the time stamp code is incremented by 1 with each recording pulse: Nt, Nt+1, Nt+2, etc. Since the frame synchronization signal is simultaneously the LRCK or CS pulse signal, each discrete count at the output of the ADC 4 will be accompanied by its own time stamp.

Thus, all discrete counts in all the channels of all the groups will be accompanied by assigning time stamps thereto at the same time. This provision enables to couple all discrete counts to a single time basis in the process of further program processing, in spite of time delays arising during asynchronous transmission of data.

The presence of embedded time stamps enables to develop systems with an unlimited number of synchronous channels without the necessity of using an additional port for time coupling in the main processor.

The invention claimed is:
1. A system for combining digital streams, comprising:
    m groups of channels for collecting synchronous data in the synchronous protocol format, each group of channels including:
        a means for pre-processing analog signals, which has N inputs for processing signals transmitted from N sources of analog signals, and N outputs,
        N/2 paired analog-to-digital converters (ADC), each having N inputs, a data stream clock synchronization input, a common synchronization input, a frame synchronization input and N/2 outputs, and
        a main processor with asynchronous interface, which has N/2 inputs and a data recording input,
        wherein the N outputs of the pre-processing means are connected to N inputs of the N/2 ADCs, and the N/2 ADC outputs are connected to the N/2 inputs of the main processor,
    a clock oscillator having:
        a control input, a first output forming a clock signal for synchronization of a BCLK data stream, a second output forming a MCLK service signal for common synchronization, and a third output forming a pulse signal of the respective synchronous protocol,
    a host processor having:
        a control bus and
        at least two asynchronous interfaces to which said at least two groups of channels are connected respectively, and
    a means of transforming the pulse signal of the respective synchronous protocol into a LRCKt signal, the means comprising:
        a circuit for selecting an edge and a fall of the pulse signal,
        a shift register having a data shift input, a first "AND" circuit and a second "AND" circuit, each of them having a first control input, a second control input, and a digital output, and a binary counter having a count input and digital outputs, wherein the control input of the clock oscillator is connected to the control bus of the host processor, the first output of the clock oscillator is connected to the ADC data stream clock synchronization input, the data recording input of the main processors, and the data transfer input of the shift register, the second output of the clock oscillator is connected to the ADC common synchronization inputs, the third output of the clock oscillator is connected to the ADC frame synchronization input, the input of the circuit for selecting an edge and a fall of the pulse signal of the respective synchronous protocol, the first control input of the first "AND" circuit and the first control input of the second "AND" circuit, the second control input of the first "AND" circuit and the second control input of the second "AND" circuit are configured to preliminary set fixed codes of the Nstart marker and the Nend marker of the pulse signal of the respective synchronous protocol, the digital output of the first "AND" circuit is connected to low-order bits of the shift register, the digital output of the second "AND" circuit is connected to high-order bits of the shift register, and the digital output of the binary counter is connected to intermediate-order bits of the shift register, and the count input of the binary counter and the recording input of the shift register are connected to the output of the circuit for selecting an edge and a fall edge of the pulse signal of the respective synchronous protocol.

2. The system of claim 1, wherein said synchronous protocol is the I2S protocol, and said pulse signal is the Left/Right Clock (LRCK) sampled clock signal of the I2S format.

3. The system of claim 1, wherein said synchronous protocol is the SPI protocol, and said pulse signal is the Chip Select (CS) chip selection signal of the SPI format.

4. A method for combining digital streams of the I2S format, wherein:

an analog signal array having a mN volume is received, which signals are transmitted from the m groups of channels for collecting synchronous data in the synchronous protocol format, each group of channels including N analog signals;

said analog signal array is pre-processed;

the processed analog signal array is forwarded to the paired ADCs and is transformed into a serial digital code in the I2S format together with formation of N/2 serial data digital streams;

said serial data digital streams are forwarded to the inputs of the main processor and are recorded at the edge of pulses of the BCLK data stream synchronization clock signal transmitted from the clock oscillator;

a time stamp is embedded into the Left/Right Clock (LRCK) sampled pulse signal of the I2S format, wherein:

the LRCK signal is transformed into a LRCKt signal, the time stamp code being generated by the binary counter, the Nt time stamp code is recorded into the shift register at the edges of the pulses, and a change of the binary counter state is fixed at the falls of the pulse, and the markers Nstart and Nend of the LRCK pulse signal are recorded into the shift register simultaneously with the recording of the Nt time stamp code, but only at the times when the LRCK pulse signal has a high level; and after recording the Nstart, Nt and Nend codes into the register, a sequence of the LRCKt complex clock signal pulses is formed under the action of the BCLK clock signal pulses.

5. The method of claim 4, characterized in that the pre-processing of an analog signal array comprises amplification, filtration and transformation, depending on properties specific to analog signals.

6. A method for combining digital streams of the SPI format, wherein:

an analog signal array having a mN volume is received, which signals are transmitted from the m groups of channels for collecting synchronous data in the synchronous protocol format, each group of channels including N analog signals;

said analog signal array is pre-processed;

the processed analog signal array is forwarded to the paired ADCs and is transformed into a serial digital code in the SPI format together with formation of N/2 serial data digital streams;

said serial data digital streams are forwarded to the inputs of the main processor and are recorded at the edges of pulses of the BCLK data stream synchronization clock signal transmitted from the clock oscillator;

a time stamp is embedded into the Chip Select (CS) pulse signal of the SPI format, wherein:

the CS signal is transformed into a LRCKt signal, the time stamp code being generated by the binary counter, the Nt time stamp code is recorded into the shift register at the edges of the pulses, and a change of the binary counter state is fixed at the falls of the pulses, and the markers Nstart and Nend of the CS signal are recorded into the shift register simultaneously with the recording of the Nt time stamp code, but only at the times when the CS signal has a high level; and after recording the Nstart, Nt and Nend codes into the register, a sequence of the LRCKt complex clock signal pulses is formed under the action of the BCLK clock signal pulses.

7. The method of claim 6, characterized in that the pre-processing of an analog signal array comprises amplification, filtration and transformation, depending on properties specific to analog signals.

* * * * *